(12) United States Patent
Smith et al.

(10) Patent No.: US 7,829,864 B2
(45) Date of Patent: Nov. 9, 2010

(54) MICROFABRICATED MINIATURE GRIDS

(75) Inventors: Rosemary Smith, Bangor, ME (US); Scott Collins, Bangor, ME (US); Brian G. Frederick, Orono, ME (US); Lawrence J. LeGore, Freedom, ME (US)

(73) Assignees: University of Maine, Orono, ME (US); Stillwater Scientific Instruments, Orono, ME (US)

( * ) Notice: Subject to any disclaimer, the term of this patent is extended or adjusted under 35 U.S.C. 154(b) by 73 days.

(21) Appl. No.: 12/082,452

(22) Filed: Apr. 11, 2008

(65) Prior Publication Data
US 2008/0265173 A1 Oct. 30, 2008

Related U.S. Application Data

(63) Continuation of application No. 11/124,424, filed on May 6, 2005, now Pat. No. 7,358,593.

(60) Provisional application No. 60/569,132, filed on May 7, 2004.

(51) Int. Cl.
*H01J 3/30* (2006.01)
(52) U.S. Cl. .................. 250/396 R; 250/281; 29/486
(58) Field of Classification Search .......... 250/286, 250/287, 281; 257/619, E29.001; 29/486
See application file for complete search history.

(56) References Cited

U.S. PATENT DOCUMENTS

| | | | |
|---|---|---|---|
| 3,999,263 A | 12/1976 | Marshall et al. | |
| 4,150,319 A | 4/1979 | Nowak et al. | |
| 5,465,480 A | 11/1995 | Karl et al. | |
| 5,652,083 A | 7/1997 | Kumar et al. | |
| 6,051,832 A | 4/2000 | Bradshaw | |
| 6,617,587 B2 * | 9/2003 | Parker et al. | 250/398 |
| 6,662,439 B1 | 12/2003 | Bhullar | |
| 6,905,614 B1 | 6/2005 | Novotny | |
| 6,977,381 B2 * | 12/2005 | Charles et al. | 250/396 R |
| 2001/0052576 A1 | 12/2001 | Shimada et al. | |
| 2001/0054690 A1 | 12/2001 | Shimada et al. | |

FOREIGN PATENT DOCUMENTS

| | | |
|---|---|---|
| GB | 2276490 A | 9/1994 |
| WO | WO 03/065763 A1 | 8/2003 |

OTHER PUBLICATIONS

Honkanen, A., et al., "Gas-silicon detector telescope for charged particle spectroscopy," Nuclear Instrument and Methods in Physics Research A, 395:217-225 (1997).

(Continued)

*Primary Examiner*—Charles D Garber
*Assistant Examiner*—Eduardo A Rodela
(74) *Attorney, Agent, or Firm*—Hamilton, Brook, Smith & Reynolds, P.C.

(57) ABSTRACT

A grid structure and method for manufacturing the same. The grid is used for gating a stream of charged particles in certain types of particle measurement instruments, such as ion mobility spectrometers and the like. The methods include various microfabrication techniques for etching and/or depositing grid structure materials on a silicon substrate.

12 Claims, 6 Drawing Sheets

OTHER PUBLICATIONS

Vlasak, P.R., et al., "An interleaved comb ion deflection gate for m/z selection in time-of-flight mass spectrometry," Rev. Sci. Instrum. 67(1):68-72 (1996).

Communication from European Patent Office, with European Search Report dated Apr. 15, 2009, European Patent Application EP 05747617 (4 pages).

Jaeger, Richard C., "Introduction to Microelectronic Fabrication," Second Edition, *Modular Series on Solid State Devices*, vol. V (2002), pp. 164-165, 168-169, 277-279.

European Application No. 05 747 617.8 Communication Pursuant to Article 94(3) EPC, dated Aug. 19, 2009.

\* cited by examiner

MICROFABRICATED MINIATURE GRIDS

RELATED APPLICATIONS

This application is a continuation of U.S. application Ser. No. 11/124,424, filed May 6, 2005 now U.S. Pat. No. 7,358,593, which claims the benefit of U.S. Provisional Application No. 60/569,132, filed on May 7, 2004. The entire teachings of the above applications are incorporated herein by reference.

BACKGROUND OF THE INVENTION

The present invention relates generally to a method for manufacturing a grid for gating a stream of charged particles. The dimensions of the grid elements determine the spatial extent of fields perpendicular to the plane of the grid, such that finer mesh grids have improved optical properties.

Certain types of particle measurement instruments, such as ion mobility spectrometers, make use of a gating device for turning on and off a flowing stream of ions or other charged particles. This is accomplished by disposing a conducting grid within the path of the ions. Alternately energizing or de-energizing the grid then respectively deflects the ions or allows them to flow undeflected.

The most common method for implementing such grid uses an interleaved comb of wires, also referred to as a Bradbury-Nielson Gate. Such a gate consists of two electrically isolated sets of equally spaced wires that lie in the same plane and alternate in potential. When a zero potential is applied to the wires relative to the energy of the charged particles, the trajectory of the charged particle beam is not deflected by the gate. To deflect the beam, bias potentials of equal magnitude and opposite polarity are applied to the two sets of wires. This deflection produces two separate beams, each of whose intensity maximum makes a corresponding angle, alpha, with respect to the path of the un-deflected beam.

One approach to manufacturing a gating grid is disclosed in U.S. Pat. No. 4,150,319 issued to Nowak, et al. In this technique, a ring-shaped frame is fabricated from a ceramic or other suitable high temperature material. The two sets of wires are wound or laced on the frame. Each set of wires is actually a single, continuous wire strand that is laced back and forth between two concentric series of through-holes that are accurately drilled around the periphery of the frame.

Another technique for manufacturing such a gate is described in U.S. Pat. No. 5,465,480 issued to Karl, et al. In this approach, the gating grid elements are produced from a thin metal foil by cutting or etching the foil to produce the grid structure. The gird elements are connected to side electrodes in a desired pattern to produce the two sets of wires. The foil grid structure is made mechanically stable by attaching it to an insulating support member. After the then-rigid grid structure is affixed to the insulating support member, the grid elements are selectively severed from the side electrodes to form the interdigitated grid.

Yet another approach for manufacturing such a grid is described in the paper by Kimmel, J. R., et al., entitled "Novel Method for the Production of Finely Spaced Bradbury-Nielson Gates," in *Review of Scientific Instruments*, Vol. 72, No. 12, December 2001, pp. 4354-4357. In this method, a guide is first manufactured out of a polymer block. The guide has a series of evenly spaced parallel grooves. A hole is drilled through the center of the polymer block; this hole eventually carries the ion beam. The machined polymer block is mounted on an insulated face of an H-shaped portion of a single sided, copper clad circuit board, with the grooves running from top to bottom of the H. The polymer-to-copper clad contacts are then fixed using an epoxy. Two small portions of the single sided copper clad board are fixed on the bottom side of the polymer in the region where the block extends over the center bar of the H-shaped copper frame.

A hand cranked, rotating screw is then used as a weaving instrument. In particular, a gold-plated tungsten wire runs from a spool over a directing screw and is coupled to the hand cranked screw by a belt. The loose end of the wire is then fixed such as by using an epoxy. A weight is hung from the wire between the directing screw and the spool in order to provide a constant tension on the wire.

A still further method was described in U.S. Patent Publication No. US-2003-0048059-A1, as published on Mar. 13, 2003. In that method, the grid is fabricated using a substrate formed of a ceramic, such as alumina. The substrate serves as a rectangular frame for a grid of uniformly spaced wires stretched across a center rectangular hole. On either side of the frame, nearest the hole, a line of contact pads are formed. Adjacent the line of contact pads, on the outboard side thereof, are formed a pair of bus bars. The contact pads and bus bars provide a way to connect the wires into the desired two separate wire sets of alternating potential. Specifically, a metal film is deposited on the surface of both sides of the ceramic through vacuum evaporation of gold, using chrome as an adhesion layer, for example. The metal film is then patterned on the front side to form the conducting elements on either side of the hole. The desired metalization pattern can be defined by a photo-resist and chemical-etch process, a lift-off process, or by using a physical mask during an evaporation. In a next sequence of steps, individual grid wires are attached to the fabricated frame. In this process, a spool of wire is provided that will serve as the grid wires, with a tensioner arrangement provided to place constant tension on the wire as the wires are attached to the substrate.

SUMMARY OF THE INVENTION

The present invention relates to fabrication of such grids using microfabrication methods such as silicon micromachining, Lithographic Galvanofronung Aboformung (LIGA) and/or other suitable techniques. A first type of grid is a Bradbury-Neilson gate that can be used for gating ion beams. A second type of grid, a so-called uni potential grid, can be used for creating regions in space with an abrupt change in potential gradient.

I. Bradbury-Neilson Gate

In a first embodiment, the invention is a "chopper" for a particle beam instrument (Bradbury-Neilson gate) which is micromachined in silicon and a method for fabricating same. Instead of metal wires or plates electrically isolated and supported by an insulating frame, the present invention is microfabricated in and on silicon. The grid elements are made from highly doped silicon to provide electrical conductors with the required alternating electrical potentials. The alternate grid elements are connected by bus bars also made from highly doped silicon. Part of the bus bars are enlarged and metalized to provide bond pads for connection to associated electronic circuits. These electrical conductors are isolated from a silicon frame by a layer of silicon oxide. The grid elements typically have a non-circular cross section rather than the circular cross section of wires used for typical Bradbury-Neilson grids. The oxide coated, silicon frame provides structural support at the ends of, and intermediate positions along, the electrical conductors to allow the cross sectional width of the conductors to be made substantially smaller than can be achieved with metal wires.

This type of chopper is fabricated from a silicon-on-insulator (SOI) wafer such as is typically used in the Micro-Electro-Mechanical Systems (MEMS) and/or semiconductor industry. The SOI wafer used for the chopper manufacture has three layers, including a highly doped device layer on the order of 100 microns thick, an insulating silicon dioxide layer on the order of 2 microns thick, and a handle layer 300 to 400 microns thick.

The required electrically conducting grid elements and bus bars are fabricated in the device layer using high aspect ratio etching. In one particular preferred embodiment, deep reactive ion etching (DRIE) of silicon, using the Bosch process, is used to fabricate these structures. Grid elements with cross sectional dimensions less than 1 micron are possible using this process. Grid elements with length between supports that are 1000 times their width have been manufactured with this process.

The required hole(s) in the supporting frame (handle layer) is also created by DRIE. The remaining silicon dioxide layer between the grid elements maybe removed by various well known dry or wet etch methods, e.g. reactive ion etching or HF acid etching.

One method for fabricating this type of grid comprises the following steps:
a. Spin coat and pattern photoresist on the device side of a silicon-on-insulator (SOI) wafer
b. Deep Reactive Ion Etch (DRIE) trenches on the device side, stopping at the silicon dioxide layer
c. Spin coat and pattern photoresist on the handle side of wafer
d. Etch the "handle" side silicon, stopping at the silicon dioxide layer
e. Reactive ion etch to remove the silicon dioxide from beneath and between grid elements
f. Deposit a metal thin film and pattern to create bond pads on the device side While one etch method has been described, it should be understood that other processes for micro-fabricating the grid structure are possible. For example, other high aspect ratio etch methods, such as crystal orientation dependent silicon etching using KOH, plasma-based methods, ion milling, and the like can be used. Wet etch methods may also be used for etch steps which do not require highly vertical side wall profiles.

Ion beam choppers fabricated by this method are an improvement over existing choppers and fabricating methods. This is true for at least the following reasons:
1. Grid elements with smaller cross sections and spacing are possible. This reduces the spatial extent of the fields, which is essential in reducing the pulse width of the ion packets.
2. The cross sectional aspect ratio can be arbitrarily chosen to have a width (perpendicular to flight path) to height (parallel to flight path) ratio greater than one to achieve high mass range in TOF-MS, equal to unity (an approximation to a Bradbury-Nielsen gate), or less than one (parallel plate deflectors) which have greater deflecting power.
3. The manufacturing method(s) described herein use standard, silicon wafer processing methods which enables the automated production of large quantities.

II. Uni-Potential Grids

High resolution time-of-flight mass spectrometers require reflectors (ion mirrors) with highly homogeneous electric fields. Each stage of the reflector is separated by a mesh or grid to establish a planar potential at the transition between stages. It is desirable for the mesh to be largely open to allow a high transmission of the ion beam. It is also desirable to have a high density of wires in the mesh in order to minimize the distortion of the field in the vicinity of the mesh. This distortion causes differences in the flight time of ions which degrades the resolution of the instrument. The mesh is also required to be planar in order to minimize differences in flight time.

Meshes currently used in ion mirrors are made by etching holes in metal sheets. The requirement of high density of wires means the holes must be small. Because metal etchants etch laterally as well as perpendicular to the surface at similar rates, it is difficult if not impossible to etch a hole smaller than the thickness of the metal. Thus small holes forces the metal to be thin. At the same time the requirement of high transmission means in a large fraction of the metal must be etched away resulting in a thin fragile structure which must be mounted under tension in order to provide a flat grid.

In the present invention, grids are fabricated from wafers, one example being silicon wafers, that can be readily etched by anisotropic methods. Grids with high transmission can be fabricated with small, closely spaced conducive elements. The dimension of the wires perpendicular to the plane of the grid can be greater than the in-plane dimension because of the difference in etch rate in the two directions resulting in a strong rigid structure. Using the present invention, grid elements 5 mm long, between support structures, and having a cross section of 5 microns by 100 microns and spaced 100 microns apart resulting in a transmission of 95%, are possible.

More particularly, in a second embodiment, the invention can be used to fabricate uni-potential grids that can be used in a number of other types of instruments. These grids are fabricated from an ordinary silicon wafer, instead of the SOI wafer used for the Bradbury-Neilson gate. However, similar to the above-described process, the grid and supporting frame are etched from a single piece of silicon.

The preferred method for making such a grid comprises the following steps.
a. Spin coat and pattern photoresist on side 1 of silicon wafer
b. DRIE trenches on side 1
c. Grow thermal silicon dioxide for KOH mask
d. Spin coat and pattern photoresist on side 2 of wafer
e. Pattern silicon dioxide with HF (hydrofluoric acid) etch
f. Etch exposed silicon in KOH (potassium hydroxide) to thin wafer in area of the grid elements until grid is suspended over an opening
g. HF etch to remove oxide between grid elements
h. Deposit thin layer of metal onto the grid to produce electrically, highly conductive surfaces There are several advantages to using this process. Prior art techniques for manufacturing uni-potential grids used isotropic etching of metals, which requires thin metal in order to produce small features. In order for such grids to have the required mechanical strength, the solid areas of the grid must be increased in size. However, this in turn has the undesirable affect of reducing the ion transmission of the grid. High aspect ratio etching which is possible in silicon allows a higher ion transmission grid to be produced, by enabling the fabrication of very small grid elements with high strength.

In addition, most known processes for etched metal grids often require a means to maintain the grid under tension in order to keep the grid flat. Tensioning is not required with the more rigid silicon grid of the present invention, in order to produce a flat grid.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 1 and 2 are a plan view and cross sectional view of the completed grid;

FIG. 3 is a cross sectional view of a Silicon-on-Insulator (SOI) starting wafer;

FIG. 4 is a section showing the wafer after the photoresist has been applied and patterned on the device side;

FIG. 5 is a section showing the trenches after the DRIE step on the device side;

FIG. 6 is a section showing the wafer after it has been mounted on a support wafer and the photoresist has been applied and patterned on the handle side;

FIG. 7 is a section showing the wafer after the silicon etch step on the handle side;

FIG. 8 is a section showing the wafer after the oxide has been etched; and

FIG. 9 is an illustration of a Bradbury-Neilson type grid after the support wafer is removed.

FIG. 10 is a plan view of the completed grid;

FIG. 11 is a section showing the wafer after the photoresist has been applied and patterned on a first side;

FIG. 12 is a section showing the wafer after the trenches have been etched by the DRIE step on the first side;

FIG. 13 is a section showing the wafer after the growth of thermal oxide on both sides;

FIG. 14 is a section showing the wafer after it has been mounted on a support wafer and the photoresist has been applied and patterned on side 2;

FIG. 15 is a section showing the wafer after the oxide has been etched on side 2;

FIG. 16 is a section showing the wafer after the silicon has been etched on side 2;

FIG. 17 is a section showing the wafer after the oxide has been removed; and

FIG. 18 is a section showing the wafer after a metal coating has been applied to all surfaces.

FIGS. 19 through 24 show process steps for forming the grid using additive micromachining techniques, such as LIGA, wherein FIG. 19 illustrates the starting substrate;

FIG. 20 is a section showing the patterned photoresist;

FIG. 21 is a section showing the deposited conductor material;

FIG. 22 is a section illustrating the result of stripping the photoresist;

FIG. 23 shows removal of a seed layer for metallization; and

FIG. 24 is a section showing the etched hole(s).

DETAILED DESCRIPTION OF THE INVENTION

A description of preferred embodiments of the invention follows.

The present invention can be used to manufacture an interleaved comb of conductors known as a Bradbury-Nielson Gate. Such a gate consists of two electrically isolated sets of equally spaced conductors that lie in the same plane and alternate in applied voltage potential.

These gates are generally recognized as having a much smaller effective field size than the more commonly used deflection plates. They can, for example, be used to modulate ion beams in time-of-flight mass spectrometers (TOF-MS), to achieve mass-to-charge selection. Such gates are also commonly used in ion mobility mass spectrometers to regulate the injection of ion packets into a drift tube.

They have also been applied to Hadmard time-of-flight mass spectrometers to modulate the source ion beam with a pseudorandom sequence of on and off pulses. Because the detected signal is then a convolution of the TOF mass spectra, the signal can be recovered by again applying the pseudorandom sequence to yield the single mass spectrum. The resulting resolution of the instrument depends on the modulation switching time, which in turn depends on the spatial extent of the fields affecting the region surrounding the chopper. Therefore, reduction in the scale of the grid elements improves the resolution of the grid.

Figure 1:
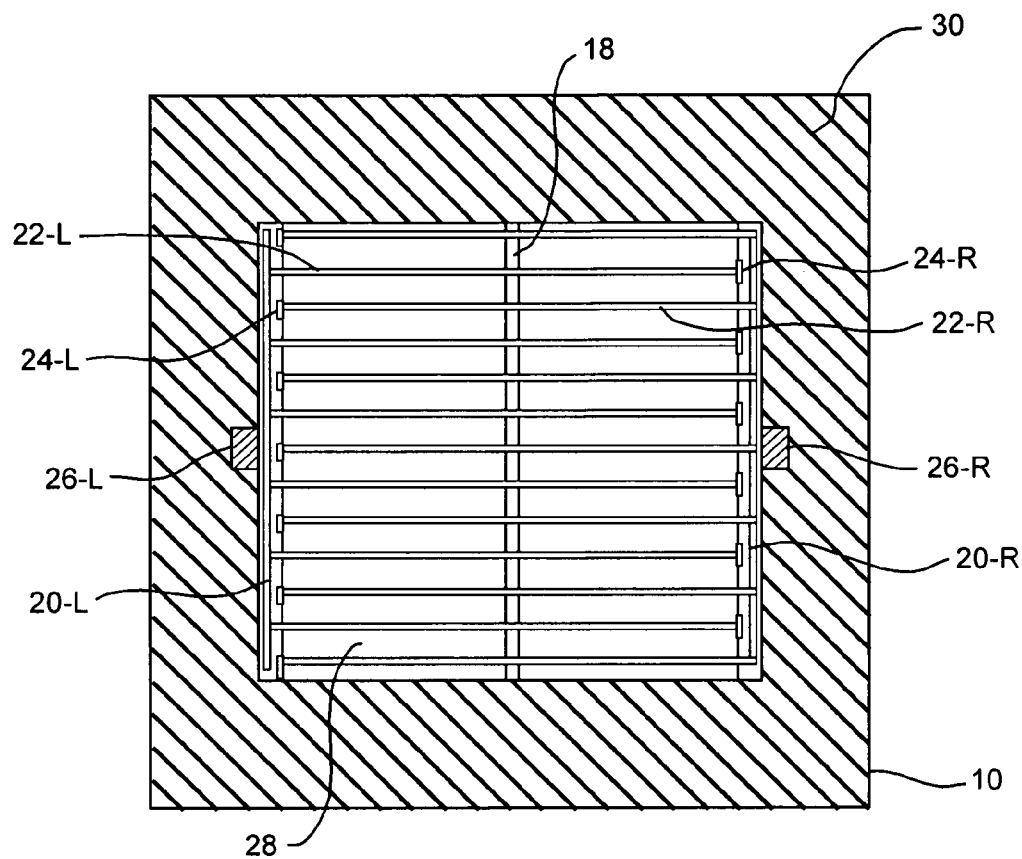
FIGS. 1 through 9 pertain to a Bradbury-Neilson type grid. In particular.
Figure 2:
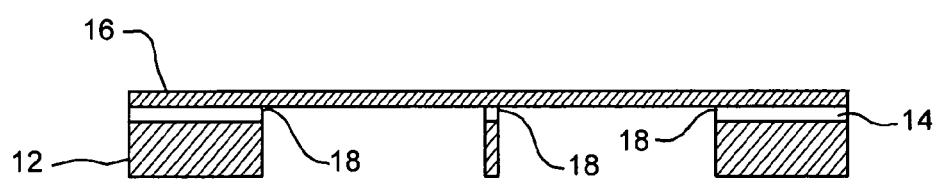
Figure 3:

FIGS. 1, 2, and 3 are illustrations of a silicon-on-insulator (SOI) substrate or portion of a wafer 10 utilized for providing a substrate for a Bradbury-Nielson type grid manufactured according to the present invention. As best seen in the cross sectional views of FIGS. 2 and 3, the wafer 10 consists of a silicon handle layer 12, a buried silicon oxide layer 14, and a highly doped silicon device layer 16. The layers of the wafer 10 may have "thickness" dimensions of, for example, 350 um for the handle layer 12, 2 um for the oxide layer 14, and 100 um for the device layer 16.

Figure 4:
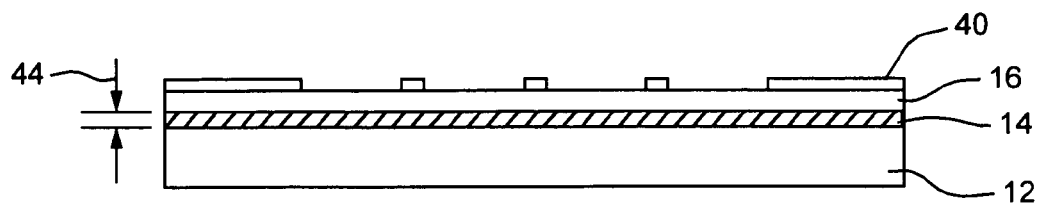

The first step (FIG. 4) in a manufacturing process is to deposit and pattern a top-side photoresist layer 40 on the device layer 16 of the wafer 10. Numerous techniques are known for accomplishing this. In a preferred embodiment, this can be by spin coating the photoresist on to the wafer, exposing the photoresist to UV light through a mask, and then developing the photoresist to remove desired areas of a pattern that defines portions of the grid. One such pattern is shown in FIG. 1. The pattern includes, for example, ground plane area 30, two bus bars 20-L, 20-R, two pads 26-L, 26-R, two sets of grid conductors 22-L, 22-R, and two sets of grid conductor anchors 24-L, 24-R where the end of the conductors are attached to the insulating supports 18. The conductors are also supported at intermediate points by additional supports 18.

The ground plane areas 30 generally surround the periphery of the wafer 10. They serve to electrically define the region surrounding the grid of conductors 22.

The bus bars 20 provide a way to electrically connect each of the two sets of grid conductors. Bus bar 20-L, located on the left side of the frame, will be used to interconnect conductors that terminate on the right side of the frame. Likewise, bus bar 20-R, located on the right side of the frame, is used to interconnect conductors that terminate on the left side of the frame.

The grid conductor anchors 24 provide a place to terminate and support one end of the respective conductors. Note that the anchors 24 are defined such that silicon is etched around the periphery on three sides thereof. This isolates the anchor providing an electrically open termination point.

Figure 5:
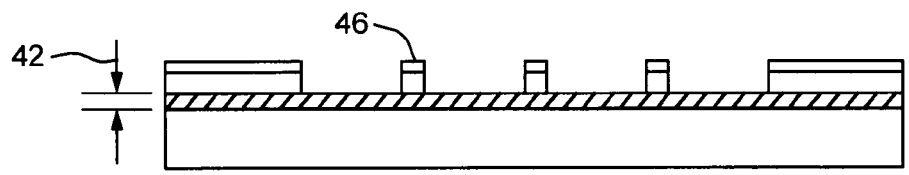

The second step (FIG. 5) is to remove the silicon exposed 46 by the removal of the photoresist in the first step. This must be done in an anisotropic manner in order to form conductors with uniform cross section and spacing. The preferred method is deep reactive ion etching (DRIE) using the Bosch process. The silicon oxide layer acts as an etch stop.

Figure 6:
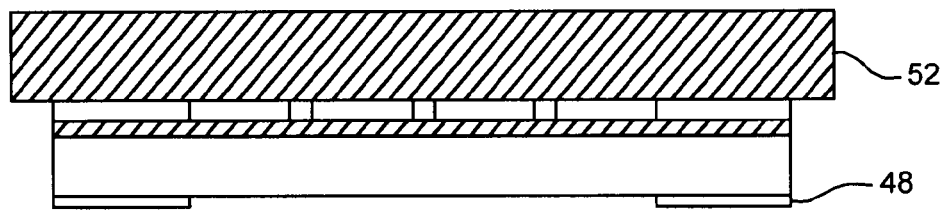

The next step (FIG. 6) is to attach the device side of the wafer 10 to a support wafer 52. This step may be unnecessary, depending on the equipment used for manufacture. A handle-side photoresist layer 48 is then deposited and patterned to expose the area of the handle layer 12 to be removed. The pattern may include (FIG. 2) one or more supports 18.

Figure 7:
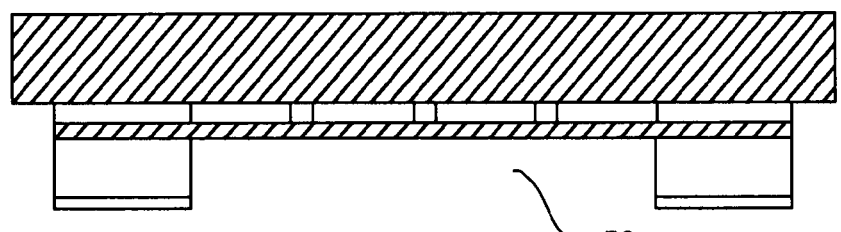
Figure 8:
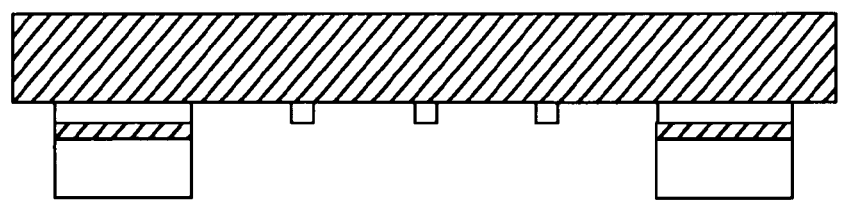

The exposed silicon 50 is then removed using a DRIE process, stopping on the silicon dioxide layer 14 as shown in FIG. 7. The silicon dioxide lying beneath and between the conductors 22 is then removed by reactive ion etching, as shown in FIG. 8.

Figure 9:

The device is then removed from the support wafer 52 (FIG. 9).

A final step typically includes the application of metal to the bond pads 26 to facilitate electrical connections to the gating grid. This can be achieved by evaporation or sputtering of a thin film of metal through a shadow mask for patterning.

In a second embodiment, the invention can be used to fabricate uni-potential grids. In the preferred method, the grid is fabricated from an ordinary silicon wafer instead of the SOI wafer used for the gating grid, but follows similar steps.

Figure 10:
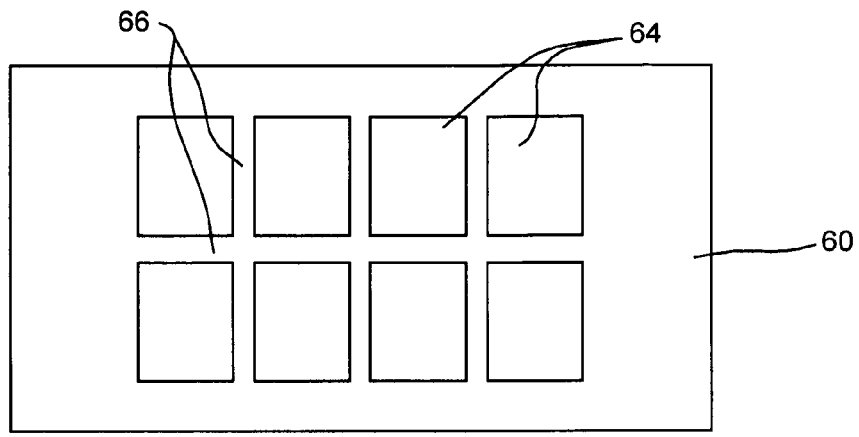
FIGS. 10 through 18 pertain to an etched silicon uni-potential grid that is manufactured according to the present invention. In particular.

FIG. 10 is an illustration of a uni-potential grid manufactured according to the present invention. The grid consists of through holes 64, conducting grid elements 66, and the surrounding frame 60. Some conducting grid elements may be made wider to provide structural support throughout the grid structure, without adversely affecting the transmission of the grid. In this type of grid, the conductive elements run along a second axis which may be perpendicular to a first axis, or have another orientation along a preferred crystalographic direction.

Figure 11:
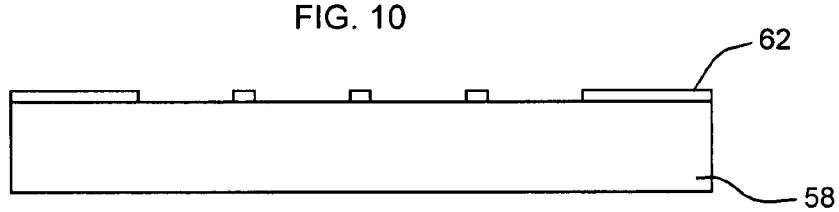

The first step (FIG. 11) is to deposit and pattern a photoresist layer 62 on a first side of the wafer 58. Numerous techniques are known for accomplishing this. In a preferred embodiment, this can be by spin coating the photoresist on to the wafer, exposing the photoresist to UV light through a mask, and then developing the photoresist to remove desired areas of the pattern. The wafer may have a thickness dimension of, for example, 350 um. The grid elements may have a dimension of 10 um or less and the holes may have dimensions on the order of 100 um.

Figure 12:
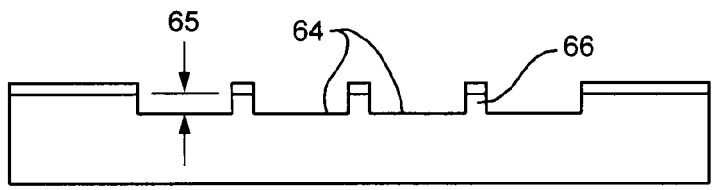

The second step is to remove the silicon exposed 64 by the removal of the photoresist in the first step. This must be done in an anisotropic manner in order to form conductors with uniform cross section and spacing. The preferred method is DRIE using the Bosch process. By knowing the etch rate, the etch process can be stopped when the desired dimension 65 of the grid elements is reached for example, 100 um, as shown in FIG. 12.

Figure 13:
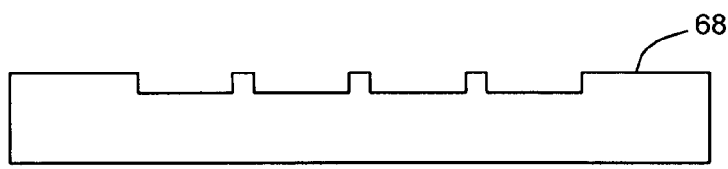

The next step (FIG. 13) is to grow a thermal oxide layer 68 on surfaces of the device to a thickness of, for example, 1 um. The oxide serves as a masking layer for subsequent wet etching of the silicon.

Figure 14:
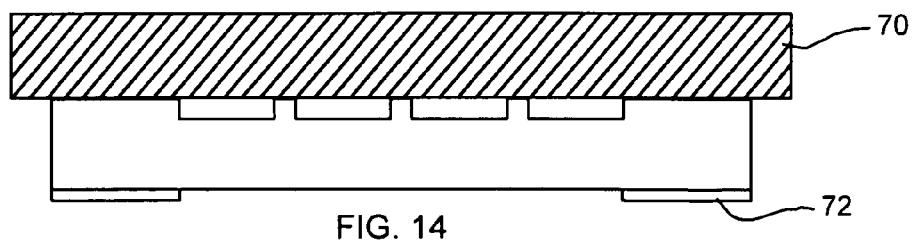
Figure 15:
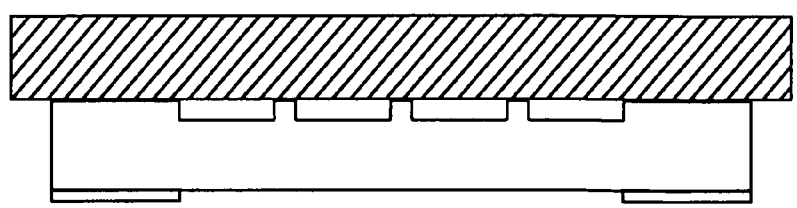
Figure 16:
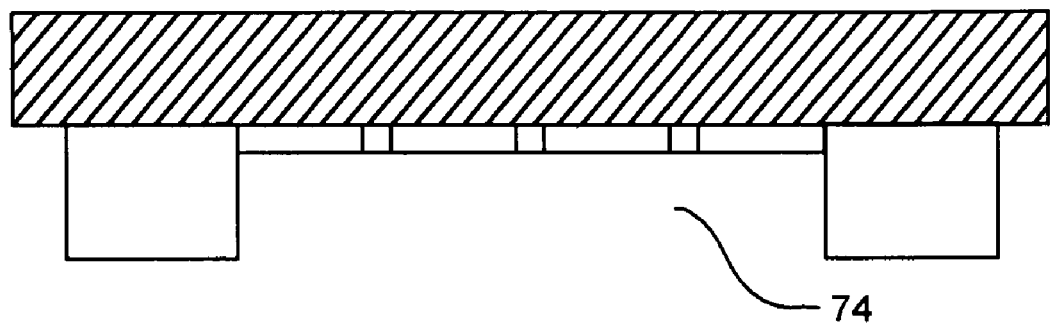
Figure 17:
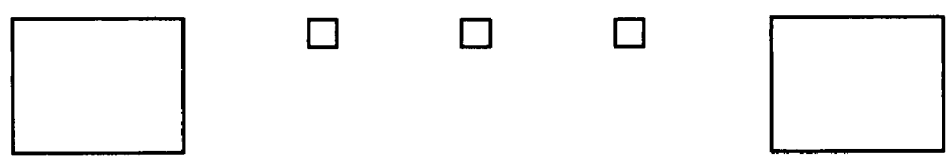

The next step is to attach the previously etched side of the wafer 58 to a support wafer 70 (FIG. 14) A photoresist layer 72 is then deposited and patterned to expose the area of the wafer to be removed 74. The exposed silicon oxide is then removed to the silicon 58. (FIG. 15) The preferred method is a buffered, HF acid, oxide etch. DRIE or a silicon wet etch, such as KOH, is used to remove the silicon 74 (FIG. 16). The remaining oxide is then removed with a buffered, HF acid, oxide etch or reactive ion etching with a recipe that is more selective to silicon oxide than silicon, producing the grid shown in FIG. 17.

Figure 18:
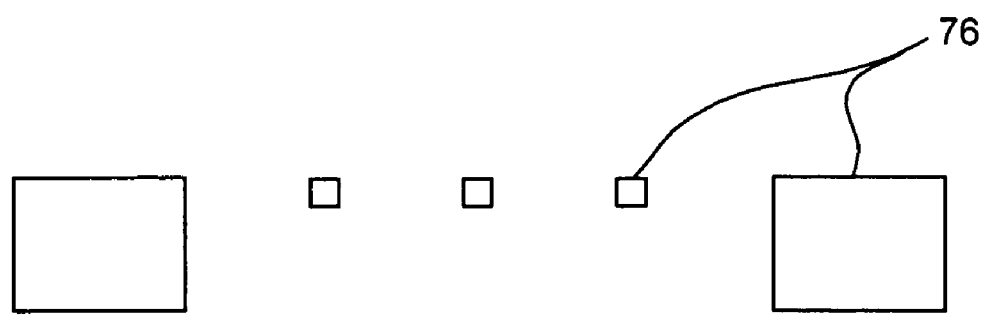

The final step (FIG. 18) is coating the grid with metal to provide a conducting surface 76. Numerous techniques are known for accomplishing this. In a preferred embodiment, this is accomplished by the vacuum evaporation of gold preceded by a chrome adhesion layer.

Yet other microfabrication techniques can be used to manufacture a grid (either the Bradbury-Neilson or uni-potential type) according to the invention. The previously described preferred embodiments involved removing material from a substrate to form the conductive grid elements. In this following embodiment, material is added to form the conductive grid elements, such as by using a Lithographic Galvanofornung Aboforming (Lithographic Electroform Molding) or LIGA process.

Figure 19:
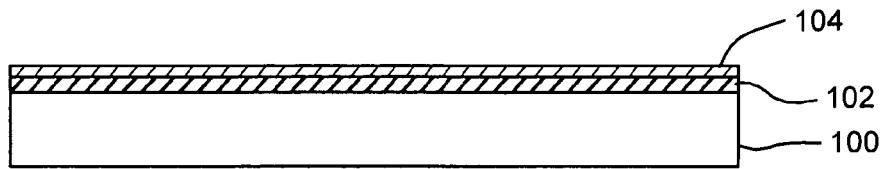

FIG. 19 is an illustration of a substrate 100 for a grid illustrating the first step of the LIGA based process. The substrate 100 may be an insulator or it may be non-insulating with an insulating layer 102 as shown.

Figure 20:
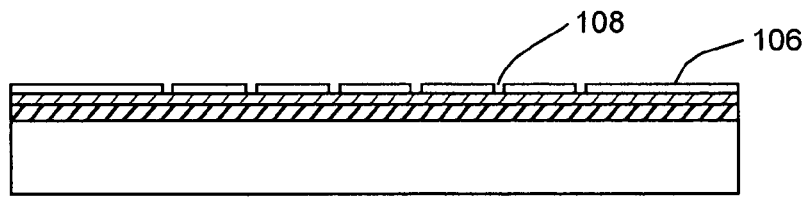

The conductive grid elements are then formed from metal by electroplating. The insulating layer 102 may be first coated with a thin metal seed layer 104 prior to the electroplating step. FIG. 20 is an illustration of the second step. A resist layer 106 is deposited and patterned to form a mold 108 for the deposition of the conductive grid elements. Numerous techniques, such as photo, x-ray, or e-beam lithography, are known for accomplishing this.

Figure 21:
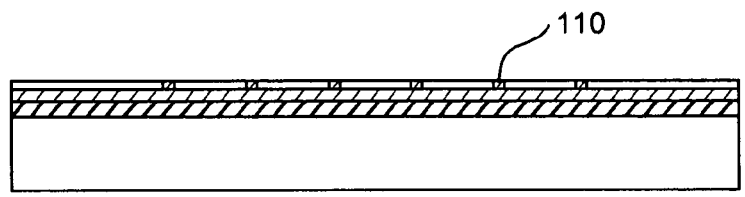

The next step is to deposit the conductive grid elements 110 in the mold pattern as illustrated in FIG. 21. This may be done by electroplating, if the material is a metal, or the conductive grid elements may be formed of other materials such as a polymer. Possible metals to use include gold, platinum, tungsten, copper, and nickel.

Figure 22:
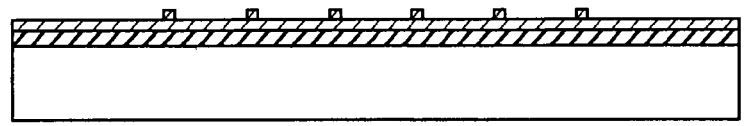
Figure 23:
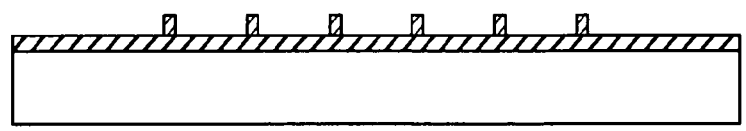

The resist 106 is then stripped and the seed layer 104, if used, is removed as illustrated in FIG. 22 and FIG. 23.

Figure 24:
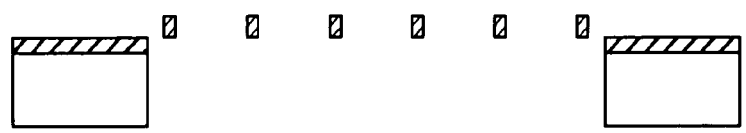

FIG. 24 is an illustration of the final step. A hole is formed in the substrate under the conductive grid elements 110 by an etching or machining process. Numerous techniques are known for accomplishing this.

The above description and drawings have shown the resulting conductive elements in more or less square cross section. However, it is possible to modify the cross sectional shape of the conductors to increase the deflecting power without increasing the effective thickness of the grid (which limits the mass range of the TOF-MS in which the grid is to be placed, for example). The DRIE processes used enable the etching aspect ratio of the conductors to be selected to optimize their cross sectional shape. For example, a trapezoidal cross section can result, which reduces scattering of deflected particles from the sides of the conductive elements, although this is not a limitation of the invention.

A number of advantages result from the teachings of the present invention.

Figure 25:
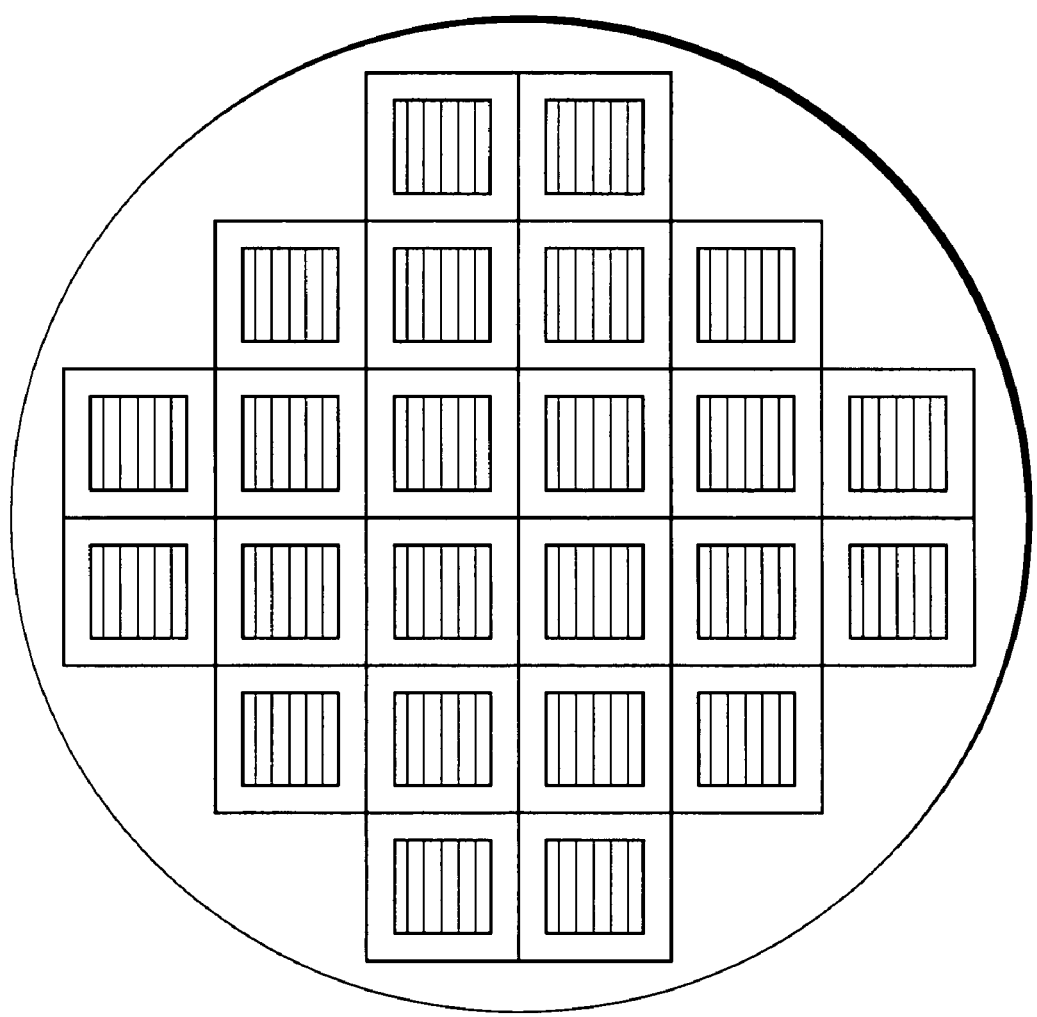
FIG. 25 illustrates a single wafer having multiple grids formed thereon.

Grids that are manufactured using microfabrication techniques according to the invention can now be batch manufactured such that large numbers of grids are made at the same time on the same wafer, as shown in FIG. 25, thereby reducing the cost per grid Microfabrication techniques typically utilize highly reproducible, patterning processes, with submicron resolution, e.g. photo, x-ray or electron beam lithography. Microfabricated grids can have conductors with micron-scale and highly reproducible dimensions, which cannot be achieved by other manufacturing methods, such as Electrodischarge Machining or Laser ablation. With microfabrication, feature dimensions are highly reproducible from device to device, and from wafer to wafer. Hence, the microfabricated grid is expected to have better performance than those manufactured by other means, since performance is directly related to conductor size, shape and spacing.

Moreover, by fabricating the conductor elements in single crystal silicon, instead of a polycrystalline metal, the conductor elements are mechanically stronger and more rigid. Single crystal silicon has a tensile strength and a modulus of elasticity which are comparable to steel, but a density that is comparable to aluminum. Hence, silicon conductors are stiff, strong, and lightweight. These mechanical attributes, combined with microfabrication processing, enables them to be self-supporting at much greater length-to-width ratios than that which can be achieved with polycrystalline metal wire or film conductors. With intermediate supporting structures, the cross sectional dimensions can be reduced to 1 um or less, while still fabricating a grid structure large enough to handle a macroscopic particle beam.

Additionally, single crystal silicon micromechanical devices demonstrate no measurable fatigue. Due to the high strength, low weight and high stiffness of silicon, silicon conductor elements undergo less displacement during operation than metal conductors of similar dimension, minimizing displacement caused variations in the field penetration into the surrounding region.

Microfabrication also enables the integrated manufacture of the conductors and their supporting substrate, eliminating the labor intensive and error prone assembly involved in other manufacturing methods, such as manual placement, winding or stretching of conductive wire elements and bonding of the conductor layer to a substrate.

While this invention has been particularly shown and described with references to preferred embodiments thereof, it will be understood by those skilled in the art that various changes in form and details may be made therein without departing from the scope of the invention encompassed by the appended claims.

The invention claimed is:

1. An integrated microfabricated grid for controlling a charged particle stream, the grid formed of a plurality of electrically isolated conductive elements, comprising:
   a substrate to serve as a support for said conductive elements at one of an end thereof, or at another support location within the grid;
   a hole in the substrate to allow the charged particle stream to pass therethrough;
   the conductive elements lying in a common plane with one another, and formed from a microfabricated, integral layer disposed adjacent the substrate, the conductive elements having at least one dimension of 10 micrometers (um) or less; and
   wherein said conductive elements are single crystal.

2. A grid as in claim 1 wherein the grid further comprises:
   a first and second set of electrically isolated, equally spaced conductors that lie in the same plane both sets of conductors also microfabricated on an integral layer insulated from the substrate, the respective sets of conductors to be applied to alternate electrical potentials.

3. A grid as in claim 1, wherein said conductive elements are a heavily doped semiconductor.

4. A grid as in claim 1, wherein the conductive elements are a semiconductor which are selected from a group consisting of silicon, germanium, or a compound semiconductor such as GaAs.

5. A grid as in claim 1, where the microfabricated elements are formed with Deep Reactive Ion Etching (DRIE).

6. A grid as in claim 1, where the microfabricated conductive elements layer are formed using photolithography.

7. A grid as in claim 1, wherein the conductive elements are microfabricated using an additive process such as LIGA.

8. A grid as in claim 1 wherein the conductive elements are further comprised of a first and second set of electrically isolated, equally spaced conductors, and the respective set of conductors are applied to alternate potentials by a common bus bar also formed as integrated part on the substrate.

9. A grid as in claim 1 wherein the conductive elements are supported at both ends thereof.

10. A grid as in claim 1 wherein the conductive elements are supported at a mid portion.

11. An integrated microfabricated grid for controlling a charged particle stream, the grid formed of a plurality of electrically isolated conductive elements, comprising:
    a substrate to serve as a support for said conductive elements at one of an end thereof, or at another support location within the grid;
    a hole in the substrate to allow the charged particle stream to pass therethrough;
    the conductive elements lying in a common plane with one another, and formed from a microfabricated, integral layer disposed adjacent the substrate, the conductive elements having at least one dimension of 10 micrometers (um) or less; and
    wherein the conductive elements and substrate are microfabricated from a silicon on insulator (SOI) wafer, the SOI wafer having a silicon layer formed adjacent to a silicon oxide insulating layer.

12. A grid as in claim 11 wherein the substrate that provides support for the conductive elements is an oxide coated micromachined silicon wafer.

* * * * *